United States Patent
Meyer-Berg

(10) Patent No.: US 7,498,674 B2
(45) Date of Patent: Mar. 3, 2009

(54) SEMICONDUCTOR MODULE HAVING A COUPLING SUBSTRATE, AND METHODS FOR ITS PRODUCTION

(75) Inventor: Georg Meyer-Berg, Munich (DE)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 11/532,321

(22) Filed: Sep. 15, 2006

(65) Prior Publication Data

US 2007/0080442 A1    Apr. 12, 2007

Related U.S. Application Data

(63) Continuation of application No. PCT/DE2005/000477, filed on Mar. 16, 2005.

(30) Foreign Application Priority Data

Mar. 18, 2004    (DE)    ........................ 10 2004 013 681

(51) Int. Cl.
*H01L 23/34* (2006.01)

(52) U.S. Cl. ........................ 257/723; 257/734; 257/773; 257/776; 257/E25.005; 257/E25.01; 257/E25.012; 257/E25.016; 257/E25.02; 257/E25.026; 257/E23.143; 438/109; 438/128

(58) Field of Classification Search ................ 257/723, 257/734, 773, 776, 777, E25.005, E25.01, 257/E25.012, E25.016, E25.02, E25.026, 257/E23.143, E23.17; 438/109, 128, FOR. 211, 438/FOR. 213

See application file for complete search history.

(56) References Cited

U.S. PATENT DOCUMENTS

| 5,801,448 | A | 9/1998 | Ball | 257/778 |
|---|---|---|---|---|
| 6,080,264 | A | 6/2000 | Ball | 156/292 |
| 6,436,735 | B1 | 8/2002 | Goetz et al. | 438/125 |
| 6,517,117 | B1 | 1/2003 | Hofstee et al. | 257/777 |
| 6,617,196 | B2 | 9/2003 | Iwaya et al. | 438/107 |
| 6,864,588 | B2 * | 3/2005 | Hung | 257/787 |
| 6,946,747 | B1 * | 9/2005 | Mori et al. | 257/786 |
| 7,091,588 | B2 * | 8/2006 | Akiyama et al. | 257/685 |

FOREIGN PATENT DOCUMENTS

| EP | 0 509 825 A2 | 10/1992 |
|---|---|---|
| FR | 2 569 052 A1 | 2/1986 |
| WO | 2005/091366 A2 | 9/2005 |

OTHER PUBLICATIONS

International Search Report and Written Opinion for International Patent Application No. PCT/DE2005/000447 (9 pages).

* cited by examiner

*Primary Examiner*—Jasmine J Clark
(74) *Attorney, Agent, or Firm*—Banner & Witcoff, Ltd.

(57) ABSTRACT

A semiconductor module has a coupling substrate which is used for the internal electrical coupling of an integrated circuit on adjacent semiconductor chips. The semiconductor chips have integrated circuits and are arranged on a mount structure. The semiconductor chips are externally connected to external contacts. The coupling substrate overlaps edge areas of the adjacent semiconductor chips.

14 Claims, 7 Drawing Sheets

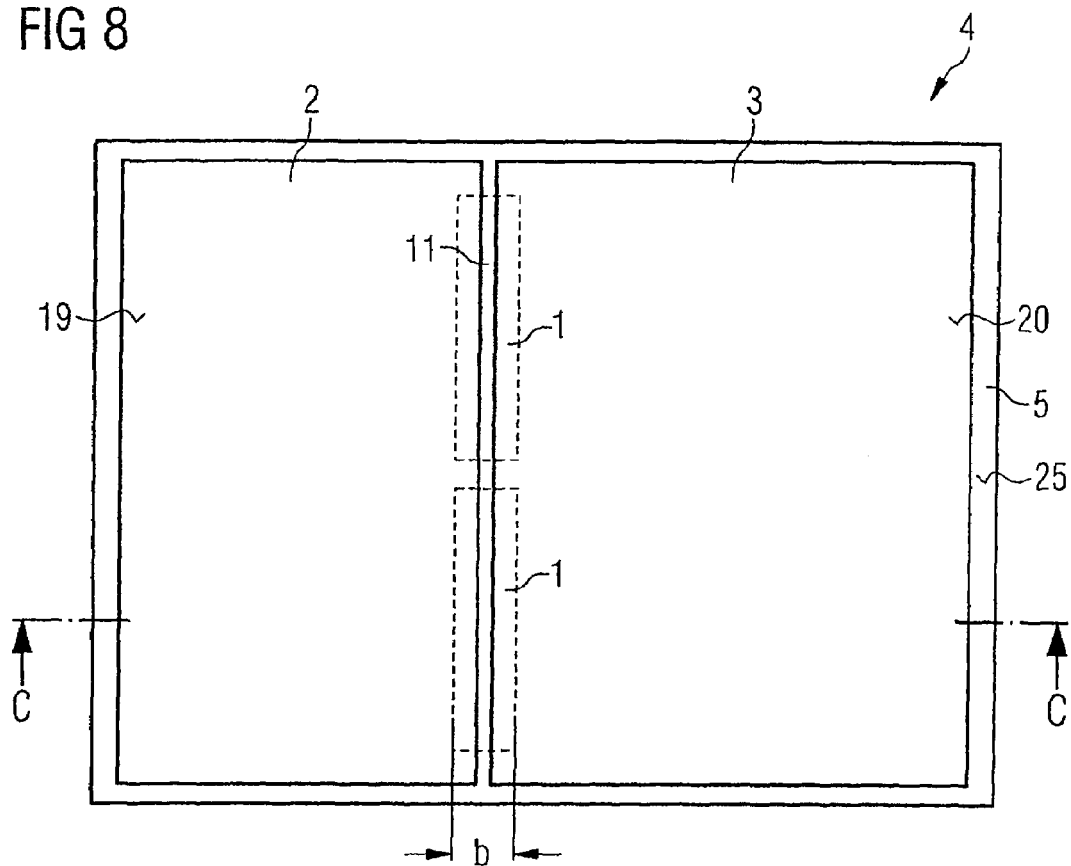
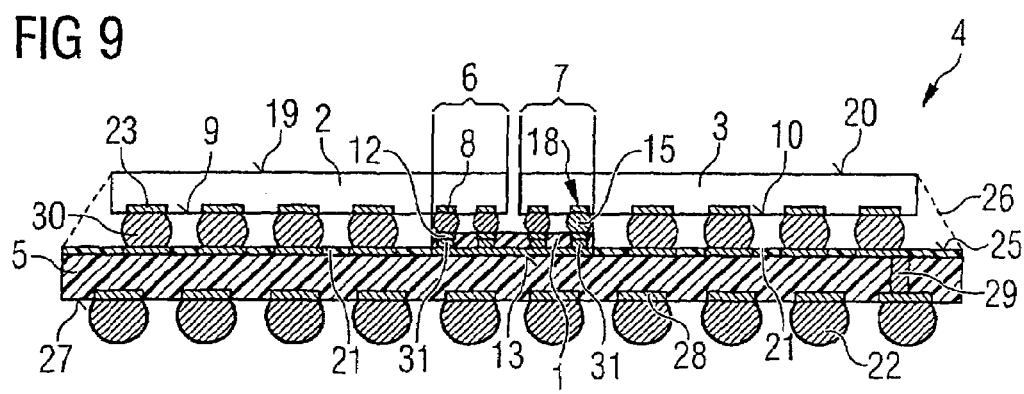

SEMICONDUCTOR MODULE HAVING A COUPLING SUBSTRATE, AND METHODS FOR ITS PRODUCTION

CROSS-REFERENCE TO RELATED APPLICATION

This application is a continuation of co-pending International Application No. PCT/DE2005/000477 filed Mar. 16, 2005, which designates the United States, and claims priority to German application number DE 10 2004 013 681.5 filed Mar. 18, 2004.

TECHNICAL FIELD

The invention relates to a semiconductor module having a coupling substrate for electrical coupling of integrated circuits on adjacent chips, and to a method for production of the semiconductor module. The semiconductor chips, with their integrated circuits, are arranged alongside one another on a wiring substrate, and are electrically connected via the wiring substrate to external contacts on the semiconductor module.

BACKGROUND

Electrical connections between the integrated circuits, without combination with an external contact, are referred to as internal connections, and are normally provided by wire bonds from one semiconductor chip to another. This has the disadvantage that the contact pads to be connected on the integrated circuits must be in the same sequence along their adjacent edges for both semiconductor chips, since crossing of bonding wires can lead to short-circuits. Furthermore, the required bonding tools may restrict the connection density between the integrated circuits on adjacent semiconductor chips to a small number of internal connections.

A further known option is to use a multilayer wiring substrate, whose structured metal layers and correspondingly planned vias allow internal connections between integrated circuits on adjacent semiconductor chips in the semiconductor module. This solution is costly since the high connection density in an interposer greatly increases the packaging costs, not least because additional "build-up" layers are required for the interposer.

Finally, it is possible to produce supplementary connections via additional flip-chip contacts between the semiconductor chips involved and the wiring substrate, in which case the limits of the connection densities in the interposer are also reached very quickly here, so that the costs rise explosively.

SUMMARY

A semiconductor module may comprise a coupling substrate for electrical coupling of and supply to integrated circuits on adjacent semiconductor chips, semiconductor chips with integrated circuits, which are arranged on a mount structure and are electrically connected via the wiring substrate to external contacts on the semiconductor module, wherein the coupling substrate overlap edge areas of adjacent semiconductor chips; and chip contact pads on active upper faces of adjacent semiconductor chips being electrically conductively connected to one another via the coupling substrate. Such a semiconductor module may avoid increasing the wiring density requirement for a wiring substrate, while nevertheless allowing integrated circuits on semiconductor chips, which are arranged alongside one another, in the semiconductor module to in some cases be internally connected to one another.

BRIEF DESCRIPTION OF THE DRAWINGS

The invention will now be explained in more detail with reference to the attached figures, in which:

FIG. 8 shows a schematic plan view of a semiconductor module having two coupling substrates according to a third embodiment;

FIG. 9 shows a schematic cross section through the semiconductor module shown in FIG. 8.

DETAILED DESCRIPTION

Figure 1:
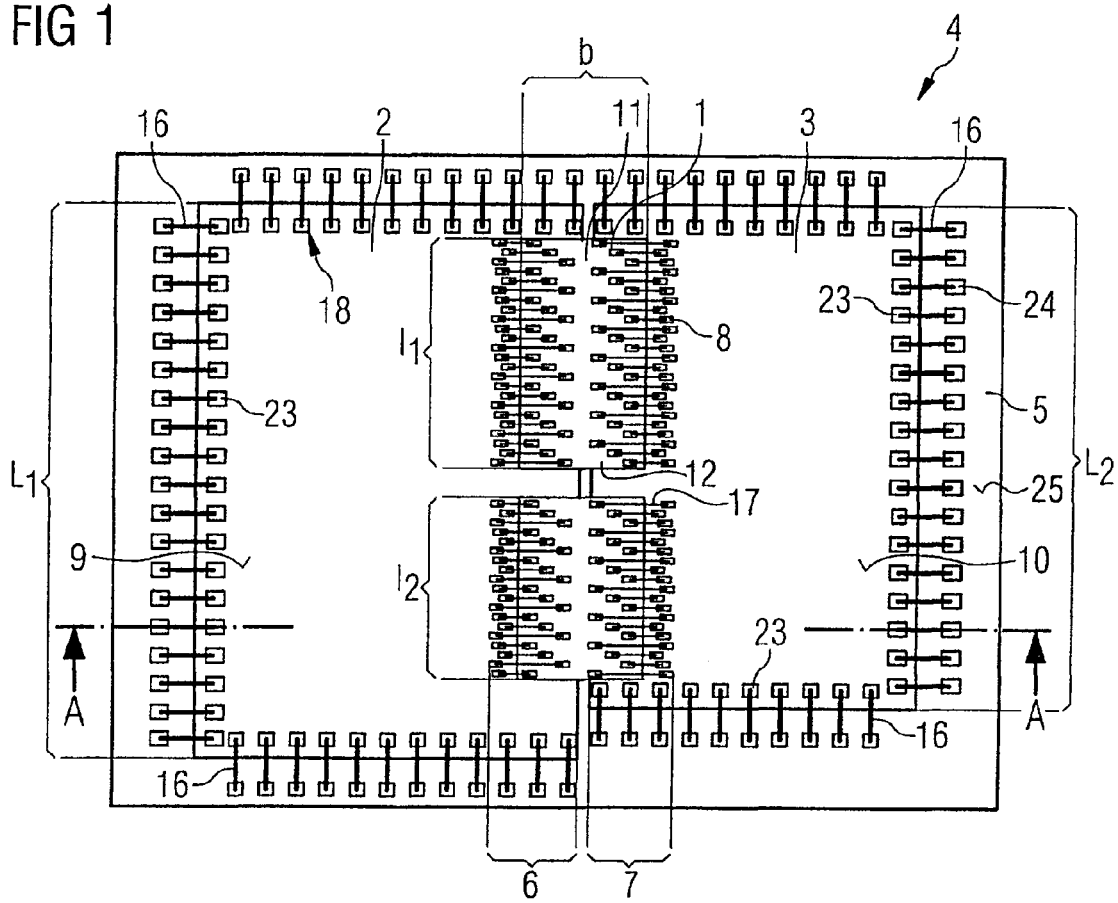
FIG. 1 shows a schematic plan view of a semiconductor module having two coupling substrates according to a first embodiment.

A semiconductor module may be provided having a coupling substrate for electrical coupling of integrated circuits on adjacent semiconductor chips. The semiconductor module may have semiconductor chips with integrated circuits. These semiconductor chips can be arranged on a mount structure, via which the semiconductor chips are electrically connected to external contacts on the semiconductor module. This mount structure may be a wiring substrate which electrically connects the small number of 10-μm-size contact pads on the semiconductor chips via wiring structures to the external contacts, whose dimensions are a few 100 μm. A mount structure may also have flat-conductor structures, which are formed with the aid of a flat-conductor frame, or a "leadframe". The coupling substrate for electrical coupling of the integrated circuits on the adjacent semiconductor chips may overlap edge areas of these adjacent semiconductor chips. Chip contact pads can be arranged on the active upper face of the semiconductor chips, and can be electrically connected to one another via the coupling substrate.

A semiconductor module such as this may have the advantage that internal connections between the integrated circuits on adjacent semiconductor chips need not run over the relatively costly wiring substrate but, in fact, can be coupled to one another via a relatively low-cost coupling substrate. Furthermore, this solution may have the advantage that there is no problem in also allowing crossings via the coupling substrate via associations with the contact pads on the semiconductor chips. The user therefore does not have to provide a strict sequence between opposite contact pads. In the extreme, it may be even possible to connect a contact pad which is located at the top left on one semiconductor chip in an integrated circuit to a contact pad which is arranged at the bottom right of an integrated circuit of an adjacent semiconductor chip. For this purpose, the coupling substrate may have an upper face with coupling contact pads, and may have a lower face opposite the upper face. The gap between the semiconductor chips and which is bridged by the coupling substrate can be filled with a plastic compound. This filled gap may give the coupling substrate additional strength, and may make the flat semiconductor module mechanically robust.

In one embodiment, the coupling substrate may have an axis of symmetry with respect to which the coupling contact pads are arranged with mirror-image symmetry, and may be electrically connected to one another via coupling interconnects on the coupling substrate. Connections for appropriately arranged contact pads on the integrated circuits on adjacent semiconductor components can then be produced by the shortest routes from contact coupling pads which are arranged symmetrically in this way. The width of the coupling substrate can be matched to the requirements for these connections between the coupling substrate and the contact pads on adjacent semiconductor chips.

In a further embodiment, the coupling pads can be electrically connected in pairs on both sides of the axis of symmetry. This internal connection in pairs between the coupling contact pads on the coupling substrate may have the advantage that no crossings occur, and it may be therefore possible to manage with a single-layer combination of an insulating mount and a metallic wiring structure for the formation of the coupling substrate thus reducing the costs of the coupling substrate.

A further advantageous coupling contact pad arrangement provides not only for signal connections and test connections to be coupled to it via the coupling substrate but also for supply potentials to be connected to it, such as $V_{DD}$ and $V_{SS}$, via the coupling substrate. For this purpose, the coupling substrate, whose length is l, can be matched to the length L of the side edges of the semiconductor chips to be coupled, and a large-area coupling contact pad for the respective supply potential can be provided in the area of the broad faces of the coupling substrate. An elongated and broad contact connecting strip can thus be formed from the longitudinal faces of the coupling substrate via a plurality of parallel-connected bonding wires to contact connecting pads for the potential supply, which strip supplies the integrated circuits to be coupled with potential voltages via bonding wires or flip-chip contacts.

Furthermore, it is possible to design the coupling contact pads in such a manner that two bonding connections are positioned on it, which lead to two adjacent semiconductor chips, connecting them to one another via such coupling contact pads. For this purpose, the coupling contact pads can be arranged staggered on the coupling substrate, and are separated from one another in such a manner that bonding connections for the supply potentials can be provided between them.

It is also possible to provide the coupling contact pads with flip-chip contacts and to arrange them in such a manner that they can be fitted directly to contact pads on the adjacent integrated circuits on the semiconductor chips. This coupling option may result in the shortest connection between the integrated circuits on the adjacent semiconductor chips. Furthermore, the flip-chip technology may simplify the coupling substrate in such a way that this solution is superior to the previous solution proposals for internal connections, as has been mentioned above. Furthermore, the flip-chip technology may make it possible to achieve a high connection density, not least because the flip-chip contacts can be fitted without the aid of bonding tools, thus allowing a shorter step width and a shorter mean separation between the coupling contact pads, and thus also between the coupling interconnects.

Furthermore, it may be possible to connect the coupling contact pads via bonding wire connections to the chip contact pads. In this case, with the mean separation between the two coupling contact pads, the respective width of the bonding tool may be taken into account, so that this admittedly may necessitate a greater step width, but the adjustment capabilities for bonding wire connections can be considerably easier than in the case of the alignment of flip-chip contacts, because the operator carrying out this work may accurately observe the coupling contact pads to be adjusted with respect to one another, and the chip contact pads. This is based on the assumption that both the active upper face of the adjacent semiconductor chips and the upper faces of the coupling substrates can be viewed using a stereo microscope, and that the coupling substrates can be arranged with their lower faces in edge areas of the adjacent semiconductor chips.

In one alternative embodiment, the coupling substrate is not arranged with its rear face on the edge faces of the semiconductor chips, but on the upper face of the wiring substrate of the semiconductor module, in such a manner that the edge areas of the adjacent semiconductor chips overlap the upper face of the coupling substrate. In this embodiment, the coupling substrate may have flip-chip contacts or surface-mounted contacts on its upper face, which can be connected to one another by means of the contact pads in an overlapping area of the semiconductor chips, when the semiconductor chips are being fitted to the wiring substrate. This embodiment may have the advantage that the coupling substrate is virtually completely mechanically protected by the adjacent semiconductor chips, because the overlapping edge areas of the semiconductor chips are arranged above the coupling substrate.

This contrasts with an arrangement in which the coupling substrate can be fixed on edge areas of the semiconductor chips with its lower face overlapping, and coupling contact pads on its upper face are electrically connected via a bonding connection to chip contact pads on the active upper faces of the adjacent semiconductor chips, although this solution results in less protection against mechanical damage. In this case, it may be necessary for the entire semiconductor module to be coated with a plastic packaging compound on the upper face of the wiring substrate, so that the semiconductor chips, the bonding connections and the coupling substrates are embedded in the plastic compound.

In a further embodiment, the coupling substrate may have passive and/or active components which provide trimming, tuning, matching, inductive coupling, and/or capacitive coupling between adjacent semiconductor chips via the coupling substrate. Passive components such as these may be resistors, coils and capacitors, which are produced as a function of the line routing. On the other hand, it is also possible to produce active components, such as thin-film transistors or thin-film diodes, on the coupling substrate, in order to increase the functionality of the integrated circuits which have been coupled to one another. Finally, it is also possible to provide so-called protection lines or "fuses", which can subsequently be interrupted as required in order to increase the modularity of the semiconductor module. There is no need to provide a special interconnect formation for fuses such as these, because normal coupling interconnects already exist in pairs between the coupling contact pads on the coupling substrate. These existing lines can be subsequently disconnected from one another simply by laser removal. An IC component with thin-film wiring can likewise also be used as a coupling substrate.

The coupling substrate may be elongated and may be matched to the edge length L of the adjacent semiconductor chips. If the edge length L of the adjacent semiconductor chips exceeds a critical length, then two, three or more coupling substrates can also be provided with an individual length l, whose total can match the overall length L.

Furthermore, a contact pad arrangement on adjacent semiconductor chips may be preferably matched to the arrangement of the coupling contact pads on the coupling substrate. The more accurately this matching is carried out, the easier it may become to maintain reliable adjustment even when flip-chip contacts are used for the coupling substrate.

The methods for production of a semiconductor module having a coupling substrate as provided by the embodiments have three main variants. These variants can be dependent on whether the semiconductor chips are arranged with flip-chip contacts or bonding connections on the wiring substrate. Furthermore, these methods are dependent on whether the coupling substrates are equipped with flip-chip contacts or are intended for bonding connections.

In a first method variant, a wiring substrate for a semiconductor module in adjacent semiconductor chips may be first of all produced using flip-chip technology, in which case the adjacent semiconductor chips have not only flip-chip contacts but also the integrated circuits on their active upper face. Next, a coupling substrate which has flip-chip contacts on its upper face can then be mounted with its lower face on the wiring substrate. During this process, the coupling substrate can be positioned in such a manner that edge areas which are provided on the semiconductor chips overlap the coupling substrate. Alternatively, the structure of the coupling substrate can also be electrically connected to the wiring substrate by means of vias. These adjacent semiconductor chips likewise may have flip-chip contacts, but with a larger diameter than the flip-chip contacts on the coupling substrate. As the next step, adjacent semiconductor chips can be fitted with the coupling substrate overlapping, and with the flip-chip contacts on the semiconductor chips being connected to the wiring substrate, and with the flip-chip contacts on the coupling substrate being connected to corresponding chip-contact pads in the edge areas of the active upper faces of the adjacent semiconductor chips.

This method has the advantage that the coupling substrate may be largely covered by the semiconductor chips which are arranged above it and overlapping it, thus protecting it against mechanical damage. Furthermore, the method has the advantage that the integrated circuits on adjacent semiconductor chips can be coupled with relatively few method steps.

A second variant of the method provides, as the first method step, for the production of a wiring substrate for a semiconductor module with adjacent semiconductor chips which have integrated circuits. The semiconductor chips may then be fitted adjacent to one another on the wiring substrate with an integral connection between the rear faces of the semiconductor chips and chip mounting surfaces on the wiring substrate. This may allow free access to chip contact pads on the upper face of the semiconductor chips. Finally, a coupling substrate which has flip-chip contacts may be fitted to the upper faces of the semiconductor chips on adjacent edge areas of the semiconductor chips. The flip-chip contacts on the coupling substrate are then electrically connected to chip contact pads on adjacent semiconductor chips in the overlapping areas between the coupling substrate and the semiconductor chips.

This connection can preferably be produced by soldering. As a final step, this may be followed by production of bonding connections between freely accessible chip contact pads on adjacent semiconductor chips and the wiring substrate. This method has the advantage that it results in the shortest possible electrical connections between the integrated circuits when the coupling substrate is fitted. The method may differ from the first method in that bonding connections must also now be taken into account, although these occur only in edge areas of the wiring substrate. Bonding connections such as these may, however, be embedded in a plastic compound, in order to protect them against mechanical damage.

A third method variant for the production of a semiconductor module provides for a wiring substrate to be produced first of all for a semiconductor module with adjacent semiconductor chips which have integrated circuits. These semiconductor chips may then be fitted to the wiring substrate with an integral connection between the rear faces of the semiconductor chips and the flip-chip contact pads on the wiring substrate and with free access to chip contact pads on the upper faces of the semiconductor chips. This may ensure complete access to the contact pads on the upper faces of the semiconductor chips. A coupling substrate can then be fitted which does not have flip-chip contacts as above, but has contact pads. This coupling substrate may be fitted with its lower face onto the edge areas of the semiconductor chips, and is integrally connected to these edge areas. Contact pads can be arranged on the upper face of the coupling substrate and may be now freely accessible, and can be connected via a bonding connection to corresponding contact pads in the semiconductor chips in order to produce an internal electrical connection between the individual integrated circuits. Finally, in this case as well, the contact pads on the semiconductor chips which are not connected to the coupling substrate can be provided with a bonding wire, which connects these contact pads to the contact connecting pads on the wiring substrate.

In this method, both the internal connections from the contact pads on the semiconductor chips to the coupling substrate and the external connections from the contact pads on the semiconductor chips to the external contact pads on the wiring substrate can be produced via the contact connecting pads using one and the same technology, thus reducing the production costs for a semiconductor module such as this.

In summary, it can be stated that all of the problems which occur in the prior art can be solved by using a small additional hierarchical coupling substrate in order to produce the internal connections between the adjacent components. Because the additional coupling substrate can be very small and it is simple to see how to produce the internal connections, this forms a more cost-effective solution than the extension of the complex wiring substrate. If, in addition, flip-chip contacts are provided for the coupling substrate, then this may overcome the disadvantages of restricted connection density, as in the case of wire bonding. Furthermore, the coupling substrate may have both active and passive circuit elements in addition, thus providing increased functionality for the semiconductor module.

FIG. 1 shows a schematic plan view of a semiconductor module 4 having two coupling substrates 1 according to a first embodiment. A plastic compound covering the semiconductor module 4 is not shown in FIG. 1, in order to illustrate the two coupling substrates 1 and their internal bonding connection 17 to the adjacent semiconductor chips 2 and 3 on a wiring substrate 5 of the semiconductor module 4. Furthermore, FIG. 1 shows the bonding wire technology which is used as the connection technique for this semiconductor module 4. Internal chip contact pads 8 are arranged for internal wiring in edge areas 6 and 7 of the adjacent semiconductor chips 2 and 3, respectively.

The two coupling substrates 1 overlap the semiconductor edges in the edge areas 6 and 7, and themselves have coupling contact pads 12. Bonding connections 17 are arranged between the coupling contact pads 12, the coupling substrates 1 and the internal chip contact pads 8 on the integrated circuits in the adjacent semiconductor components 2 and 3, and provide the internal bonding connection 17 between the internal chip contact pads 8 and the coupling contact pads 12. The adjacent semiconductor chips 2 and 3 have external chip contact pads 23 for the external connections of the semiconductor module 4 to its external contacts. These external chip contact pads 23 are connected via bonding connections 16 to contact connecting pads 24 on an upper face 25 of the wiring substrate 5.

While the semiconductor chips 2 and 3 have respective edge lengths of $L_1$ and $L_2$, the coupling substrates 1 have respective lengths $l_1$ and $l_2$, with a width b. Since, in this embodiment, two coupling substrates 1 are provided for the lengths $l_1$ and $l_2$ on the semiconductor chips 2 and 3, the lengths $l_1$ and $l_2$ of the coupling substrates are shorter than half the edge length L of the semiconductor chips 2 and 3. The width b of the coupling substrate is chosen such that this allows an adequate number of coupling contact pads 12 in pairs, and an adequate number of coupling contact pads 12, whose symmetry is staggered with respect to an axis of symmetry.

Figure 2:
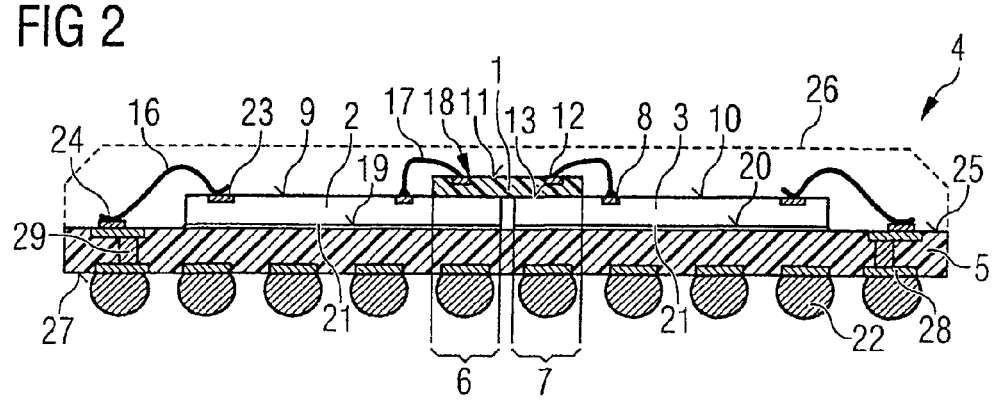
FIG. 2 shows a schematic cross section through the semiconductor module shown in FIG. 1.

FIG. 2 shows a schematic cross section through the semiconductor module 4 as shown in FIG. 1, along the section plane AA in FIG. 1. The semiconductor chips 2 and 3 are arranged with their rear faces 19 and 20 adjacent to chip mounting surfaces 21 on the upper face 25 of the wiring substrate 5. The lower face 13 of the coupling substrate 1 is integrally connected to the edge areas 6 and 7 of the respective semiconductor chips 2 and 3. The lower face 13 of the coupling substrate 1 is integrally connected to the edge areas 6 and 7 of the semiconductor chips 2 and 3, respectively. The coupling contact pads 12 in this embodiment are arranged opposite one another in pairs, and are connected via bonding connections 17 to the internal chip contact pads 8, which are opposite one another in pairs. This results in an internal bonding connection between the circuit of the integrated circuit on the semiconductor chip 2 and the circuit of the integrated circuit on the semiconductor chip 3 on the active upper face 10 of the semiconductor chips. This coupling substrate 1 thus reduces the load for the connection density for the wiring substrate 5 for the semiconductor module 4. The external contacts 22 on the lower face of the wiring substrate 5 at the same time form the external contacts 12 of the semiconductor module 4. These external contacts 22 represent external connection capabilities, and are connected via external contact pads 28 on the wiring substrate 5, for example by means of vias 29 through the wiring substrate 5, to contact connecting pads 24 on the upper face 25 of the wiring substrate 5. From there, there is a bonding connection 16 to chip contact pads 23 on the upper face 10 for the respective semiconductor chips 2 and 3. The contour of the semiconductor module package is indicated by a dashed line 26.

Figure 3:
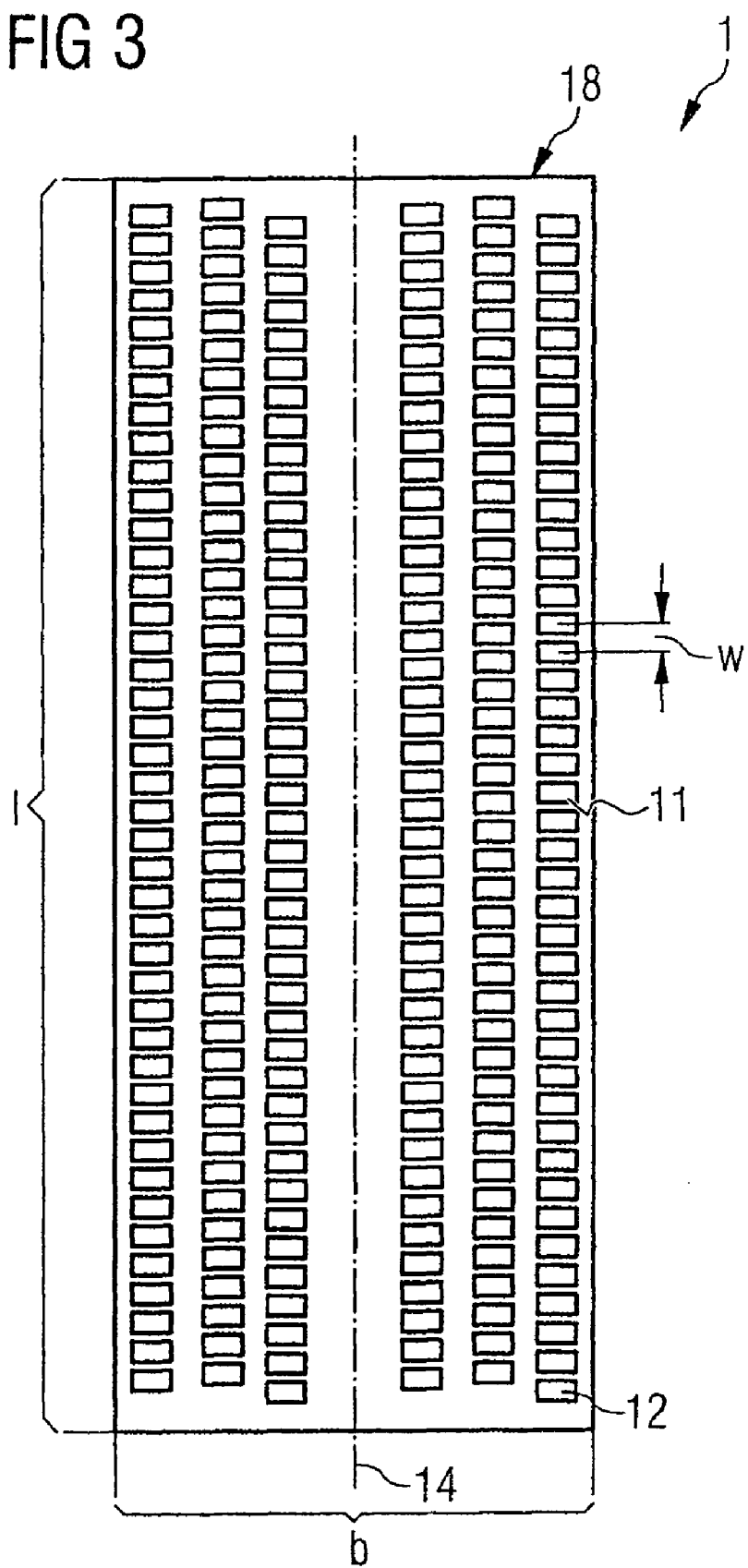
FIG. 3 shows a schematic plan view of an upper face of a coupling substrate for the first embodiment as shown in FIG. 1.

FIG. 3 shows a schematic plan view of an upper face 11 of a coupling substrate 1 with a coupling contact pad arrangement 18 for the first embodiment, as shown in FIG. 1. The overall edge length l of the coupling substrate 1 is 2.6 mm, and the overall width b for this embodiment is 0.7 mm. The step width w for the coupling contact pads 12 is, for example, 80 µm, so that coupling lines which are not shown connect the coupling contact pads 12, which are arranged in pairs on both sides of the axis of symmetry 14. With an edge length l of 10 mm, approximately 500 coupling contact pads 12 can be provided on both sides of the axis of symmetry 14 on the coupling substrate 1.

Since, in the first embodiment, bonding connections are provided, the coupling contact pads 12 are rectangular, and a minimum step width w cannot be undershot, because of the dimensions of the bonding tool. Furthermore, three rows of coupling contact pads 12 are provided on both sides of the axis of symmetry 14, with the alignment of the coupling contact pads 12 being offset from one row to the next and taking account of the thickness of a bonding wire, so that, if there are three rows, three bonding wires can be arranged alongside one another without them touching one another and without short-circuits being caused.

Figure 4:
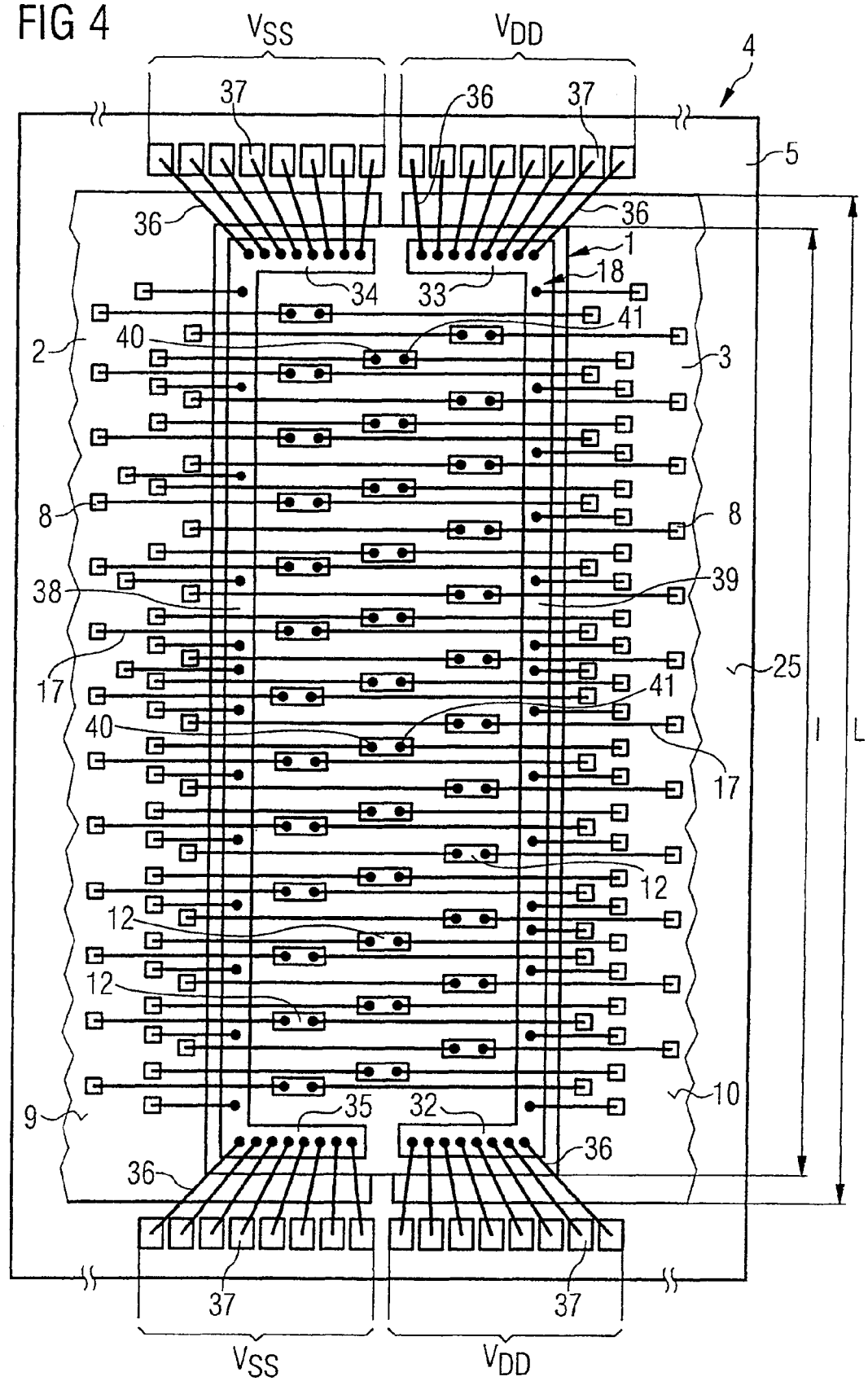
FIG. 4 shows a schematic plan view of a semiconductor module having one coupling substrate.

FIG. 4 shows a schematic plan view of a semiconductor module 4 having a coupling substrate 1. This coupling substrate 1 has a coupling contact pad arrangement 18 which differs from the coupling substrate 1 shown in FIG. 3.

With this coupling substrate 1, not only are signal connections and test connections coupled via the coupling substrate 1, but supply potentials are also connected via the coupling substrate 1, such as, $V_{DD}$ and $V_{SS}$. For this purpose, the edge length l of the coupling substrate 1 corresponds approximately to the edge length L of the side edges of the semiconductor chips 2 and 3 to be coupled. Furthermore, large-area coupling contact pads 32, 33, 34 and 35 for the respective supply potential $V_{DD}$ or $V_{SS}$ are provided in the area of the broad faces of the coupling substrate 1. An elongated and broad contact connecting strip 38, 39 can thus be formed on the longitudinal faces of the coupling substrate 1 by means of a plurality of parallel-connected bonding wires 36 to contact pad surfaces 37 for the potential supply. These contact connecting strips 38 and 39 supply the respective potential voltages, $V_{DD}$ and $V_{SS}$ to the integrated circuits that are to be coupled, via the parallel-connected bonding wires 36 or via flip-chip contacts, as is shown in FIG. 8.

The other coupling contact pads 12 are designed in such a manner that two bonding connections 40 and 41 can be positioned on them, which lead to adjacent semiconductor chips 2 and 3 and are connected to one another via the coupling contact pads 12. For this purpose, the coupling contact pads 12 are arranged staggered on the coupling substrate 1, and are separated from one another in such a manner that bonding connections 42 to supply potentials $V_{DD}$ and $V_{SS}$ are possible between them.

Figure 5:
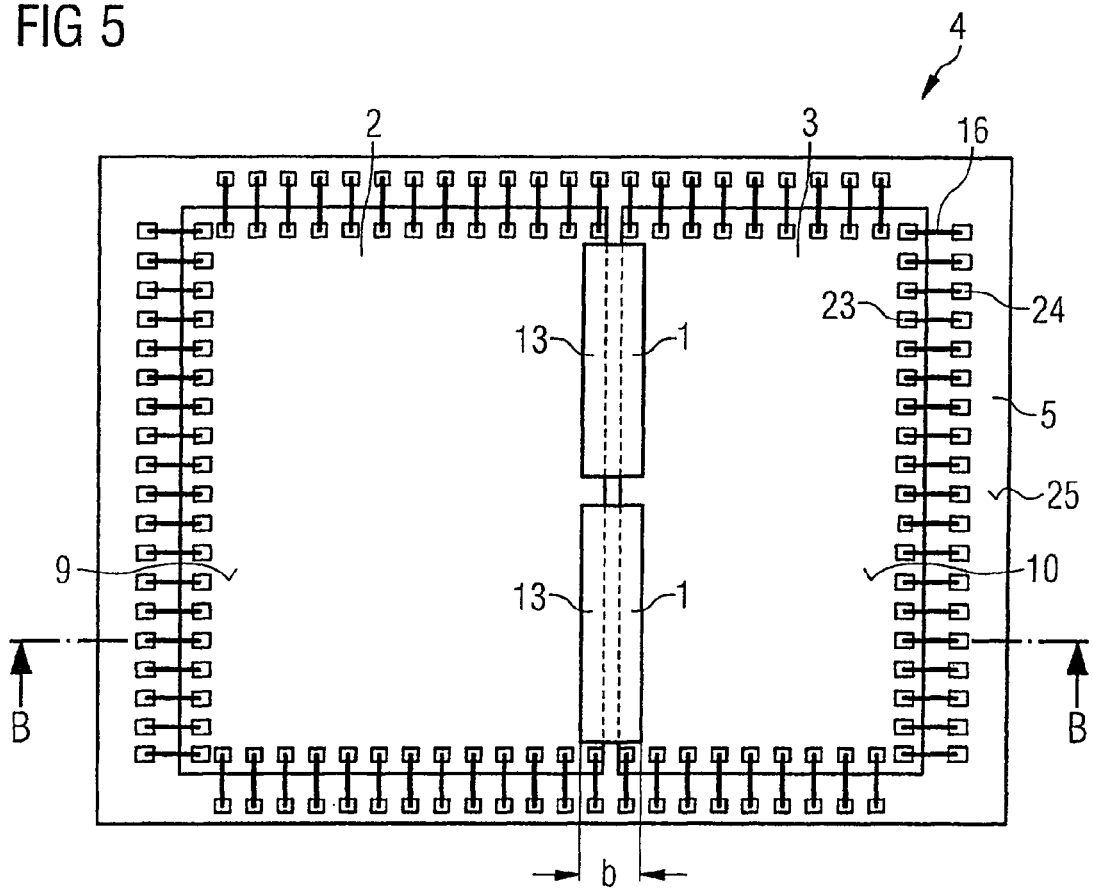
FIG. 5 shows a schematic plan view of a semiconductor module having two coupling substrates, according to a second embodiment.

FIG. 5 shows a schematic plan view of a semiconductor module 4 having two coupling substrates 1 according to a second embodiment. Components with the same functions as in the previous figures are identified with the same reference symbols, and will not be explained again. The difference between this second embodiment and the first embodiment as shown in FIG. 1 is that the two coupling substrates 1 do not have any bonding connections 1 but have flip-chip contacts instead, which correspond with corresponding internal contact connecting pads 24 on the integrated circuits on the adjacent semiconductor chips 2 and 3. Only the contact pads 23, which are intended for an external connection, on the edge faces of the semiconductor chips 2 and 3 are connected via bonding connections 16 to contact connecting pads 24 on the upper face 25 of the wiring substrates.

Figure 6:
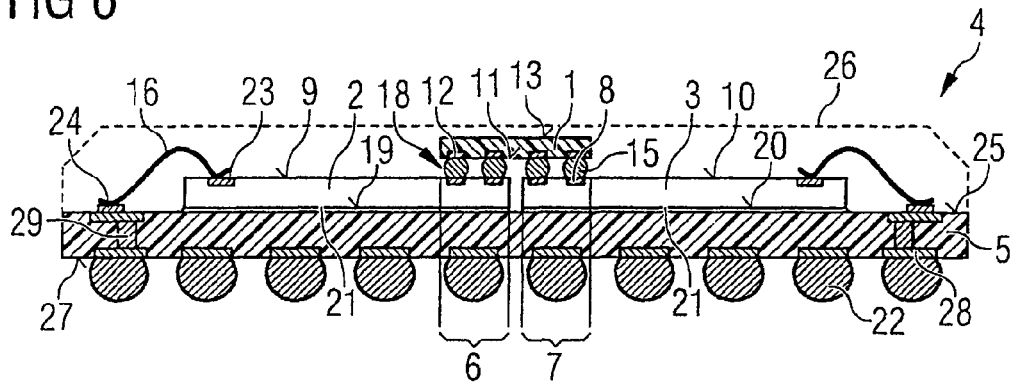
FIG. 6 shows a schematic cross section through a semiconductor module as shown in FIG. 5.

FIG. 6 shows a schematic cross section through a semiconductor module 4 as shown in FIG. 5, along the section BB in FIG. 4. The upper face 11 of the coupling substrate 1 is aligned with the upper faces 9 and 10 of the respective semiconductor chips 2 and 3 and have flip-chip contacts 15 on this upper face 11 which are connected to internal chip contact pads 8. A coupling substrate 1 such as this may be designed to be more compact and may have more coupling contact pads 12 than a coupling substrate 1 as is shown in the first embodiment in FIG. 1. In FIG. 5, a dashed line 26 once again indicates the contour of one possible semiconductor module package.

Figure 7:
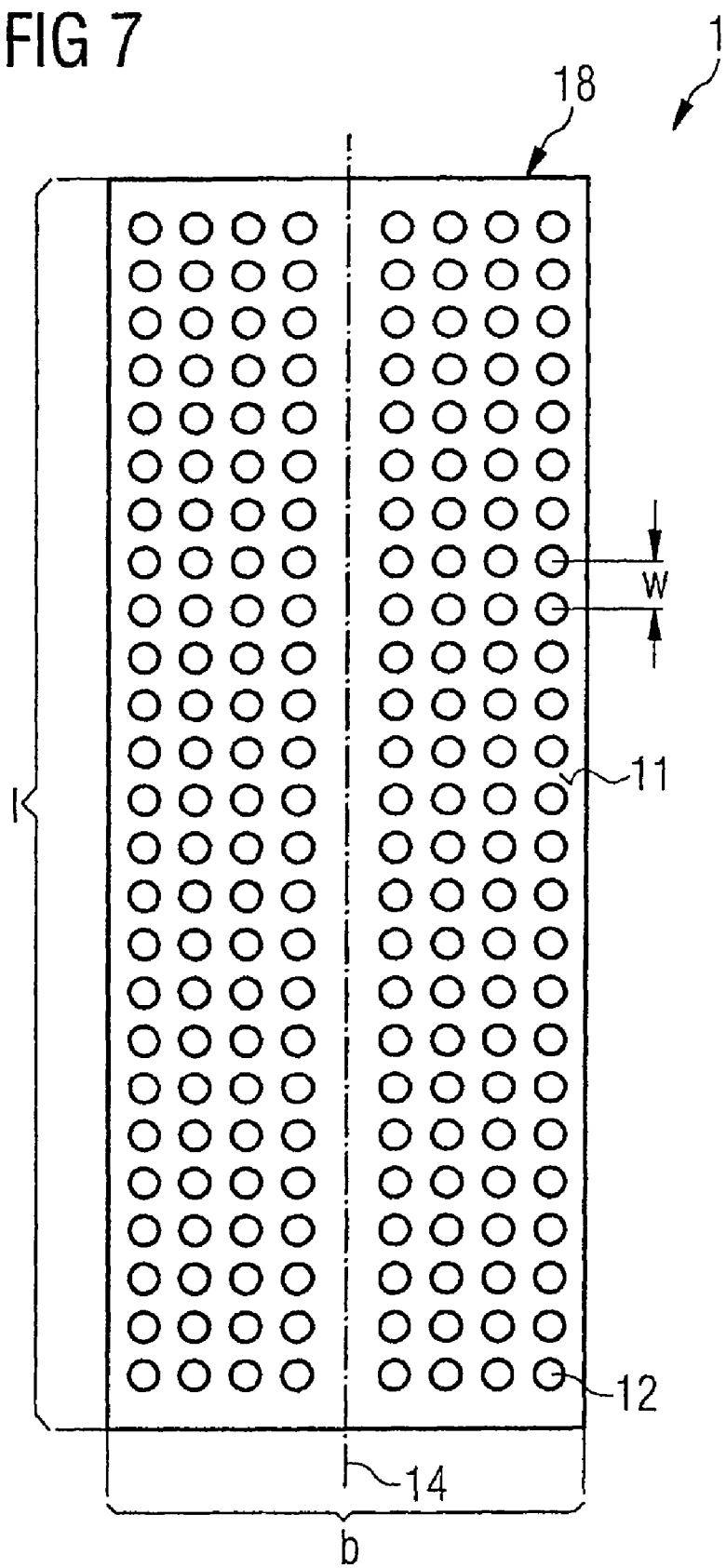
FIG. 7 shows a schematic plan view of an upper face of a coupling substrate for the second embodiment as shown in FIG. 5.

FIG. 7 shows a schematic plan view of an upper face of a coupling substrate 1 having a coupling contact pad arrangement 18 for the second embodiment as shown in FIG. 4. The edge length l of the coupling substrate 1 is 1.5 mm, and the width b is 0.45 mm. The step width w for the coupling contact pads 12 which are provided for flip-chip contacts is likewise 60 μm, and four rows of coupling contact pads 12 can be accommodated on this area of the coupling substrate 1, on each side of the axis of symmetry 14. There are thus a total number of 100 coupling contact pads 12 on each side of the axis of symmetry 14. With an edge length l of 10 mm, up to 650 coupling contact pads 12 can be accommodated in the same arrangement. One advantage of flip-chip contacts on a coupling substrate 1 is that the coupling contact pads 12 for flip-chip contacts can be arranged in rows and columns and need not be provided in an offset form, as in the case of coupling contact pads 12 which are provided for bonding connections, as in FIG. 3.

FIG. 8 shows a schematic plan view of a semiconductor module 4 having two coupling substrates 1 according to a third embodiment. Components having the same functions as in the previous figures are identified by the same reference symbols, and will not be explained again. The third embodiment differs from the first and second embodiments in that the coupling substrate 1 is arranged with its lower face 13 integrally on the wiring substrate 5, and is connected via flip-chip contacts 15 to internal chip contact pads in edge areas and on the respective semiconductor chips 2 and 3.

FIG. 9 shows a schematic cross section through the semiconductor module 4 as shown in FIG. 8, along the section plane CC in FIG. 7. The coupling substrate 1 is arranged between the wiring substrate 5, on which it is electrically conductively fixed by its lower face 13 and the semiconductor chips 2 and 3. The flip-chip contacts 15 on the coupling substrate 1 have a smaller diameter than the flip-chip contacts 30 on the semiconductor chips 2 and 3, and some of them are electrically connected by means of vias 31 to the wiring substrate 5.

In consequence, the rear faces 19 and 20 of the semiconductor chips 2 and 3, respectively, can at the same time form an upper face of the semiconductor module 4, while the external contacts 22 are arranged on the lower face 27. In this semiconductor module 4, a heat sink can be fitted to the rear faces 19 and 20 of the semiconductor chips 2 and 3, without impeding thermal conduction by means of a plastic packaging compound. A dashed line 26 once again indicates the possible outlines of a plastic package which, in this case, may be composed of an "undermold" material. The flip-chip contacts 30 of the semiconductor chips 2 and 3 have a larger diameter than the flip-chip contacts 15 on the coupling substrate. Furthermore, this diameter difference is compensated for by the coupling substrate 1 itself.

Figure 10:
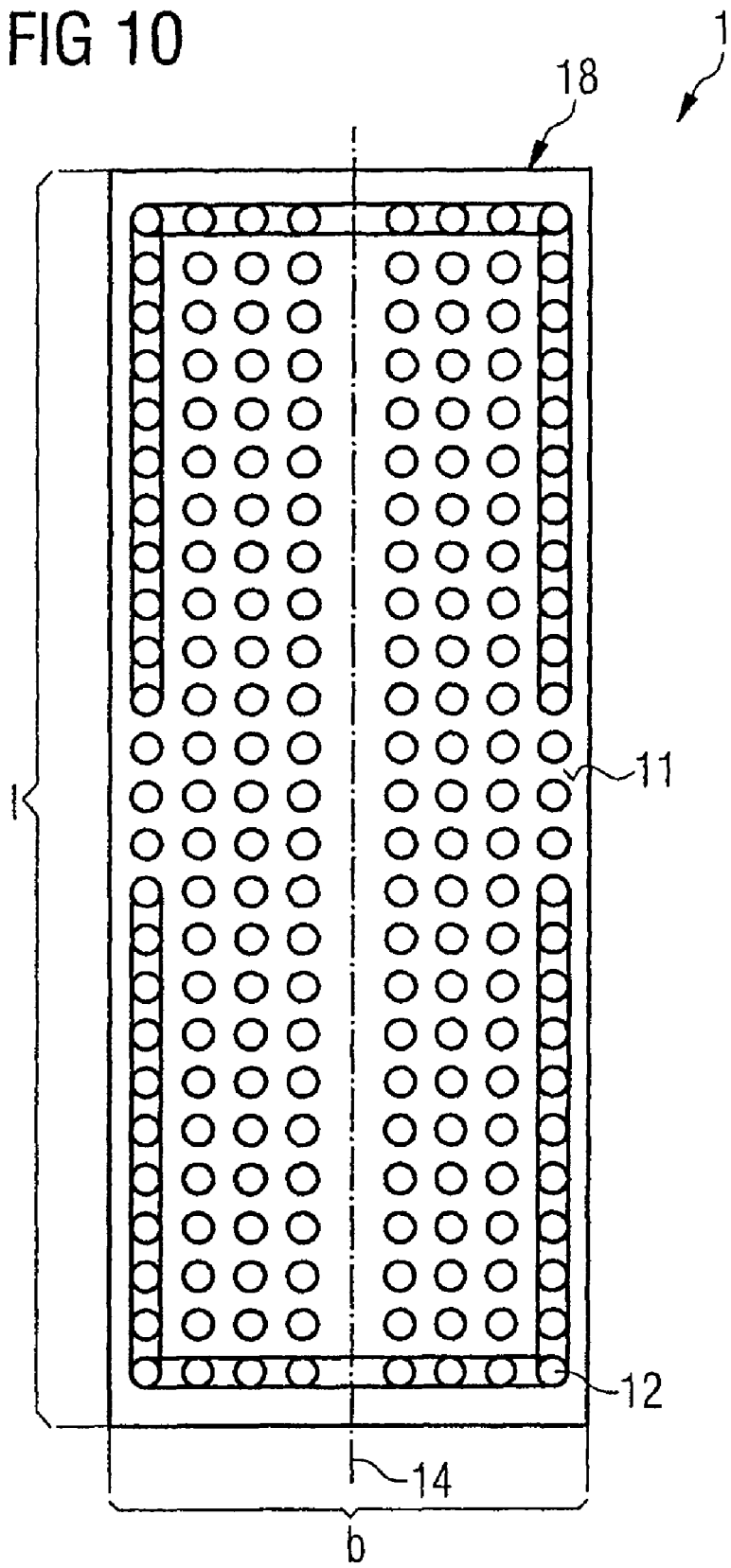
FIG. 10 shows a schematic plan view of an upper face of a coupling substrate for the third embodiment as shown in FIG. 8.

FIG. 10 shows a schematic plan view of an upper face 11 of a coupling substrate 1 for the third embodiment as shown in FIG. 8. A plurality of flip-chip contacts 30 are interconnected via interconnects 43 to form large-area supply connections for the respective supply potential $V_{DD}$ or $V_{SS}$ which supply both semiconductor chips with supply potentials, with these being electrically connected by means of the vias through the coupling substrate 1 to supply lines on the wiring substrate in the semiconductor module.

What is claimed is:

1. A semiconductor module comprising
    a coupling substrate configured so as to provide electrical coupling of and supply to integrated circuits on adjacent semiconductor chips,
    semiconductor chips each comprising an integrated circuit, the semiconductor chips being electrically connected via a wiring substrate to external contacts on the semiconductor module, wherein the coupling substrate overlaps edge areas of adjacent ones of the semiconductor chips; and
    chip contact pads on active upper faces of adjacent semiconductor chips being electrically conductively connected to one another via the coupling substrate,
    wherein the coupling substrate comprises coupling contact pads and has an axis of symmetry with respect to which the coupling contact pads are arranged with mirror-image symmetry, and are electrically connected to one another via coupling interconnects on the coupling substrate.

2. The semiconductor module according to claim 1, wherein the coupling substrate comprises an upper face and a lower face opposite the upper face, the coupling contact pads being disposed on the upper face.

3. The semiconductor module according to claim 1, wherein the chip contact pads are electrically connected in pairs on both sides of the axis of symmetry.

4. The semiconductor module according to claim 2, wherein the coupling contact pads comprise flip-chip contacts.

5. The semiconductor module according to claim 2, wherein the coupling contact pads comprise bonding wire connections to the chip contact pads.

6. The semiconductor module according to claim 1, wherein the coupling substrate comprises a lower face and an upper face opposite the lower face and is arranged with its lower face on the wiring substrate, and is electrically connected via flip-chip contacts on the upper face of the coupling substrate to the chip contact pads on the semiconductor chips using flip-chip technology.

7. The semiconductor module according to claim 1, wherein the coupling substrate comprises flip-chip contacts which are electrically connected to the chip contact pads in the edge areas of the adjacent semiconductor chips.

8. The semiconductor module according to claim 1, wherein the coupling substrate comprises a lower face and an upper face opposite the lover face and is fixed with its lower face overlapping the edge areas of the semiconductor chips, and the coupling contact pads on its upper face are electrically connected via bonding connections to the chip contact pads on the active upper faces of the adjacent semiconductor chips.

9. The semiconductor module according to claim 1, wherein the coupling substrate comprises components configured to provide at least one of trimming, tuning, matching, inductive coupling, and capacitive coupling between the adjacent semiconductor chips via the coupling substrate.

10. The semiconductor module according to claim 1, wherein the coupling substrate is elongated and is matched to an edge length of the adjacent semiconductor chips.

11. The semiconductor module according to claim 1, wherein an arrangement of the chip contact pads arrangement on the adjacent semiconductor chips is matched to an arrangement of the coupling contact pads on the coupling substrate.

12. A method for production of a semiconductor module having a coupling substrate configured to provide electrical coupling of integrated circuits on adjacent semiconductor chips, the method comprising:

producing a wiring substrate for the semiconductor module with the adjacent semiconductor chips using flip-chip technology, which comprise the integrated circuits;

fitting of a coupling substrate, which comprises flip-chip contacts on its upper face, with its lower face on the wiring substrate in such a manner that the coupling substrate is arranged in an overlapping manner between positions which are provided for adjacent semiconductor chips, wherein the coupling substrate comprises coupling contact pads that comprise the flip-chip contacts, and the coupling substrate has an axis of symmetry with respect to which the coupling contact pads are arranged with mirror-image symmetry, and are electrically connected to one another via coupling interconnects on the coupling substrate; and fitting of the adjacent semiconductor chips overlapping the coupling substrate, and with the flip-chip contacts on the semiconductor chips being connected to the wiring substrate, and with the flip-chip contacts on the coupling substrate being connected to corresponding chip contact pads in edge areas of active upper faces of the adjacent semiconductor chips.

13. A method for production of a semiconductor module having a coupling substrate configured to provide electrical coupling of integrated circuits on adjacent semiconductor chips, the method comprising:

producing a wiring substrate for the semiconductor module with the adjacent semiconductor chips, which comprise the integrated circuits;

fitting of the adjacent semiconductor chips on the wiring substrate with an integral connection between rear faces of the semiconductor chips and chip mounting services of the wiring substrate and with free access to chip contact pads that are freely accessible on upper faces of the adjacent semiconductor chips;

fitting of a coupling substrate which comprises flip-chip contacts, with the flip-chip contacts of the coupling substrate being electrically connected to the chip contact pads on the adjacent semiconductor chips in overlap areas between the coupling substrate and the adjacent semiconductor chips, wherein the coupling substrate comprises coupling contact pads that comprise the flip-chip contacts, and the coupling substrate has an axis of symmetry with respect to which the coupling contact pads are arranged with mirror-image symmetry, and are electrically connected to one another via coupling interconnects on the coupling substrate; and producing bonding connections between the chip contact pads on the adjacent semiconductor chips and the wiring substrate.

14. A method for production of a semiconductor module having a coupling substrate configured to provide electrical coupling of integrated circuits on adjacent semiconductor chips, the method comprising:

producing a wiring substrate for the semiconductor module with the adjacent semiconductor chips, which comprise the integrated circuits;

fitting of the adjacent semiconductor chips on the wiring substrate with an integral connection between rear faces of the semiconductor chips and chip mounting services of the wiring substrate and with free access to chip contact pads on upper faces of the adjacent semiconductor chips;

fitting of a coupling substrate with its lower face on edge areas of the adjacent semiconductor chips, with the coupling substrate having freely accessible coupling contact pads on its upper face, wherein the coupling substrate has an axis of symmetry with respect to which the coupling contact pads are arranged with mirror-image symmetry, and are electrically connected to one another via coupling interconnects on the coupling substrate; and producing bonding connections between the coupling contact pads of the coupling substrate and the chip contact pads of the adjacent semiconductor chips, and production of bonding connections between the chip contact pads on the adjacent semiconductor chips and the wiring substrate.

* * * * *

UNITED STATES PATENT AND TRADEMARK OFFICE
CERTIFICATE OF CORRECTION

PATENT NO. : 7,498,674 B2  
APPLICATION NO. : 11/532321  
DATED : March 3, 2009  
INVENTOR(S) : George Meyer-Berg Page 1 of 1

It is certified that error appears in the above-identified patent and that said Letters Patent is hereby corrected as shown below:

In Column 10, Claim 8, Line 48:
Please delete "lover face" and insert --lower face--.

In Column 10, Claim 11, Line 62:
Please delete "chip contact pads arrangement" and insert --chip contact pads--.

Signed and Sealed this

Twenty-fourth Day of November, 2009

David J. Kappos
*Director of the United States Patent and Trademark Office*